(12) United States Patent
Cohen et al.

(10) Patent No.: US 10,845,444 B2
(45) Date of Patent: Nov. 24, 2020

(54) SYSTEM AND METHOD FOR MAGNETIC RESONANCE FINGERPRINTING USING NEURAL NETWORKS TRAINED WITH SPARSELY SAMPLED DICTIONARIES

(71) Applicant: THE GENERAL HOSPITAL CORPORATION, Boston, MA (US)

(72) Inventors: Ouri Cohen, Teaneck, NJ (US); Bo Zhu, Cambridge, MA (US); Matthew S. Rosen, Somerville, MA (US)

(73) Assignee: The General Hospital Corporation, Boston, MA (US)

( * ) Notice: Subject to any disclaimer, the term of this patent is extended or adjusted under 35 U.S.C. 154(b) by 269 days.

(21) Appl. No.: 15/872,449

(22) Filed: Jan. 16, 2018

(65) Prior Publication Data

US 2018/0203081 A1 Jul. 19, 2018

Related U.S. Application Data

(60) Provisional application No. 62/447,204, filed on Jan. 17, 2017.

(51) Int. Cl.
*G01R 33/48* (2006.01)
*G01R 33/56* (2006.01)
(Continued)

(52) U.S. Cl.
CPC ......... *G01R 33/4828* (2013.01); *G01R 33/50* (2013.01); *G01R 33/5608* (2013.01);
(Continued)

(58) Field of Classification Search
CPC ............... G01R 33/4828; G01R 33/50; G01R 33/5608; G06N 3/08; G06N 3/04; G06N 3/084
(Continued)

(56) References Cited

U.S. PATENT DOCUMENTS

| 2006/0012367 A1* | 1/2006 | Meaney | A61B 5/0035 324/315 |
| 2011/0229005 A1* | 9/2011 | Den Harder | G06K 9/3233 382/131 |

(Continued)

OTHER PUBLICATIONS

Wang, S., Su, Z., Ying, L., Peng, X., Zhu, S., Liang, F., Feng, D. and Liang, D., Apr. 2016. Accelerating magnetic resonance imaging via deep learning. In 2016 IEEE 13th International Symposium on Biomedical Imaging (ISBI) (pp. 514-517). IEEE. (Year: 2016).*

(Continued)

*Primary Examiner* — Christopher P McAndrew
(74) *Attorney, Agent, or Firm* — Quarles & Brady LLP

(57) ABSTRACT

Disclosed is a system and method for estimating quantitative parameters of a subject using a magnetic resonance ("MR") system using a dictionary. The dictionary may include a plurality of signal templates that sparsely sample acquisition parameters used when acquiring data. The acquired data is compared with the dictionary using a neural network. Thus, systems and methods are provided that are more computationally efficient, and have reduced data storage requirements than traditional MRF reconstruction systems and methods.

22 Claims, 10 Drawing Sheets
(6 of 10 Drawing Sheet(s) Filed in Color)

(51) Int. Cl.
  *G01R 33/50* (2006.01)
  *G06N 3/04* (2006.01)
  *G06N 3/08* (2006.01)
(52) U.S. Cl.
  CPC .............. *G06N 3/04* (2013.01); *G06N 3/08* (2013.01); *G06N 3/084* (2013.01)
(58) Field of Classification Search
  USPC ........................................................ 324/309
  See application file for complete search history.

(56) References Cited

U.S. PATENT DOCUMENTS

| | | | | |
|---|---|---|---|---|
| 2011/0254548 | A1* | 10/2011 | Setsompop | G01R 33/4835 324/309 |
| 2012/0035464 | A1* | 2/2012 | Raju | A61N 7/02 600/411 |
| 2013/0096414 | A1* | 4/2013 | Lu | G01R 33/483 600/410 |
| 2013/0116540 | A1* | 5/2013 | Li | G06T 7/0016 600/410 |
| 2013/0267755 | A1* | 10/2013 | Chebrolu | A61N 5/1067 600/1 |
| 2013/0338930 | A1* | 12/2013 | Senegas | G01R 33/546 702/19 |
| 2015/0212177 | A1* | 7/2015 | Ahmad | G01R 33/5619 324/309 |
| 2015/0212182 | A1* | 7/2015 | Nielsen | G01R 33/56509 702/191 |
| 2016/0327606 | A1* | 11/2016 | Van Wieringen | G01R 33/385 |
| 2016/0338613 | A1* | 11/2016 | Beckers | A61B 5/7257 |

OTHER PUBLICATIONS

Wang, Y., Xu, C., You, S., Tao, D. and Xu, C., 2016. Cnnpack: Packing convolutional neural networks in the frequency domain. In Advances in neural information processing systems (pp. 253-261). (Year: 2016).*

* cited by examiner

SYSTEM AND METHOD FOR MAGNETIC RESONANCE FINGERPRINTING USING NEURAL NETWORKS TRAINED WITH SPARSELY SAMPLED DICTIONARIES

CROSS-REFERENCE TO RELATED APPLICATIONS

This application is based on, claims priority to, and incorporates herein by reference in its entirety for all purposes, U.S. Application Ser. No. 62/447,204, filed Jan. 17, 2017, and entitled, "SYSTEM AND METHOD FOR MAGNETIC RESONANCE FINGERPRINTING USING NEURAL NETWORKS TRAINED WITH SPARSELY SAMPLED DICTIONARIES."

STATEMENT REGARDING FEDERALLY SPONSORED RESEARCH

N/A

BACKGROUND OF THE DISCLOSURE

The present disclosure relates to systems and methods for magnetic resonance imaging ("MRI"). More particularly, the disclosure relates to systems and methods for producing quantitative parameter maps using magnetic resonance fingerprinting ("MRF") using efficient dictionary techniques.

MRF is an imaging technique that enables quantitative mapping of tissue or other material properties based on random or pseudorandom measurements of the subject or object being imaged. Examples of parameters that can be mapped include longitudinal relaxation time, $T_1$; transverse relaxation time, $T_2$; main magnetic field map, $B_0$; and proton density, $\rho$. MRF is generally described in U.S. Pat. No. 8,723,518, which is herein incorporated by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle, radio frequency ("RF") pulse phase, TR, echo time ("TE"), and sampling patterns, such as by modifying one or more readout encoding gradients.

The data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given voxel are estimated to be the values that provide the best signal template matching.

Quantitative parameters are estimated in MRF by matching acquired signals with pre-computed signals that are stored in a dictionary of tissue parameters. To ensure that a correct match is found for each acquired signal, the dictionary must cover a large range of tissue parameters and must have a fine resolution. These two requirements result in dictionaries that are large (e.g., on the order of one million entries). As a consequence of the large dictionary size, significant processing time is required to match acquired signals to the dictionary, and large storage space is needed to store the dictionaries.

Thus, there remains a need to provide systems and methods for MRF that are more computationally efficient, and have reduced data storage requirements.

SUMMARY OF THE PRESENT DISCLOSURE

The present disclosure addresses the aforementioned drawbacks by describing a system and method for estimating quantitative parameters of a subject using a magnetic resonance imaging ("MRI") system using a dictionary. More particularly, the dictionary may include a plurality of signal templates that sparsely sample acquisition parameters used when acquiring data. The acquired data is compared with the dictionary using a neural network. Thus, systems and methods are provided that are more computationally efficient, and have reduced data storage requirements than traditional MRF reconstruction systems and methods.

In accordance with one aspect of the present disclosure, a neural network is trained using a dictionary with tissue parameter data. The neural network can be used to reconstruct acquired magnetic resonance (MR) data acquired using a magnetic resonance fingerprinting acquisition process.

In accordance with another aspect of the present disclosure, the dictionary used to train the neural network may include a subset of possible tissue parameter combinations, and can thus be "sparsely sampled." Such neural networks may achieve, for example, a 10-fold, 100-fold, or greater reduction (relative to the fully sampled dictionaries) in the number of coefficients used to reconstruct MR data. Compact representation of the neural network can allow fast reconstruction of MR data despite large numbers of tissue parameters being studied.

The foregoing and other aspects and advantages described in the present disclosure will appear from the following description. In the description, reference is made to the accompanying drawings that form a part hereof, and in which there is shown by way of illustration a preferred embodiment. This embodiment does not necessarily represent the full scope of the invention, however, and reference is made therefore to the claims and herein for interpreting the scope of the invention.

BRIEF DESCRIPTION OF THE DRAWINGS

The present invention will hereafter be described with reference to the accompanying drawings, wherein like reference numerals denote like elements. The patent or application file contains at least one drawing executed in color. Copies of this patent or patent application publication with color drawing(s) will be provided by the Office upon request and payment of the necessary fee.

FIG. 10 is a schematic illustration of a reconstruction architecture in accordance with the present disclosure designed to receive data acquired using optimized MRF EPI sequence fed voxelwise into a four layer neural network containing two 300×300 hidden layers, where the network was trained by a dictionary generated with the Extended Phase Graph algorithm with the tan h and sigmoid functions used as activation functions of the first and last hidden layers respectively, such that the network outputs the underlying tissue parameters T1 and T2, and can output other tissue parameters including M0, B0, B1 and the like.

DETAILED DESCRIPTION OF THE INVENTION

Figure 1:
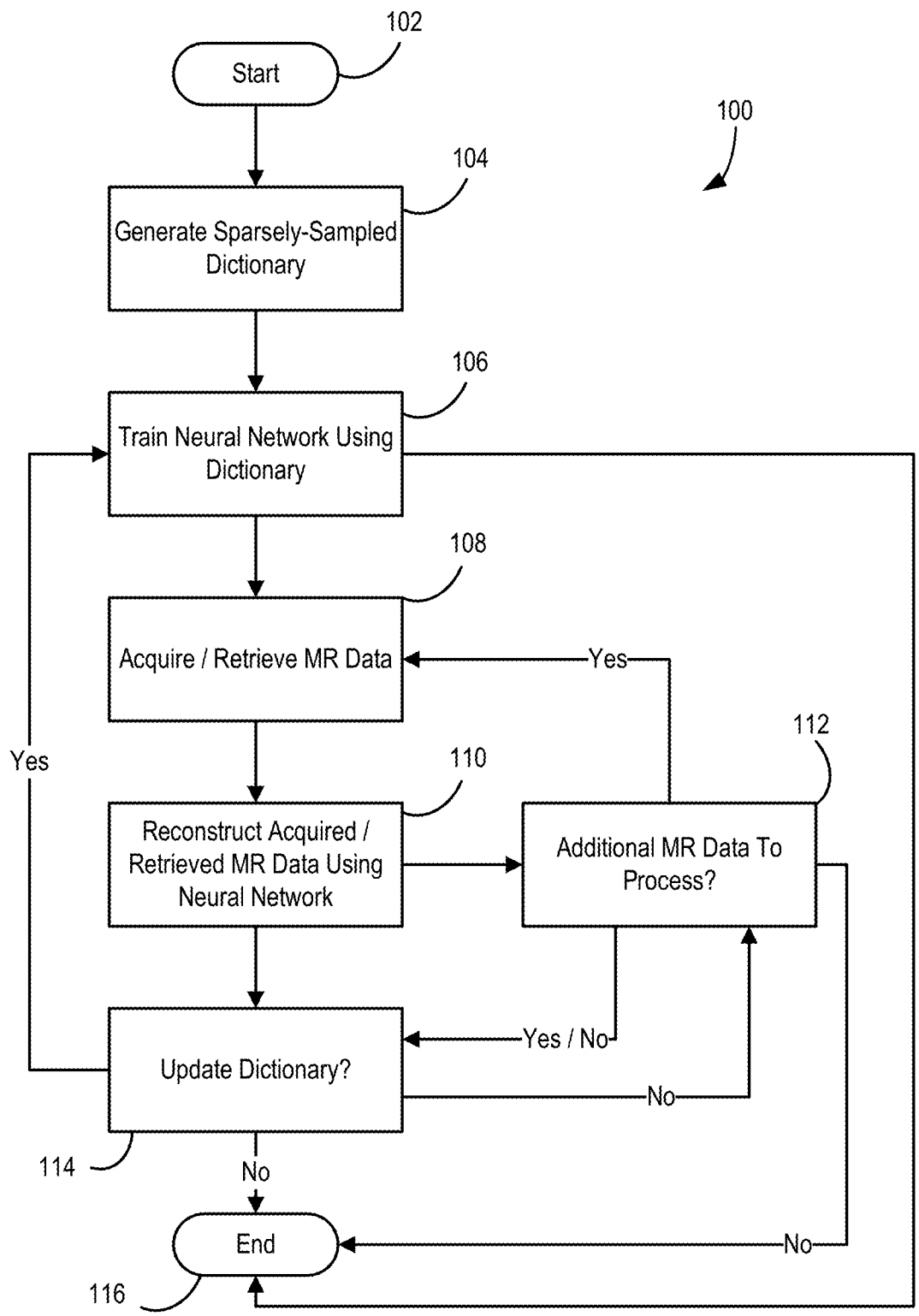
FIG. 1 is a flowchart setting forth the steps of an example method for performing magnetic resonance fingerprinting ("MRF") using a sparse dictionary and neural network for quantitative image or map reconstruction.

Described here are systems and methods for estimating quantitative parameters with magnetic resonance fingerprinting ("MRF"), in which acquired signal vectors are matched using a sparsely sampled dictionary to train a neural network, which allows for simultaneously quantifying multiple different tissue parameters maps in a fraction of the computational time required by conventional MRF techniques.

In general, MRF is an imaging technique that enables quantitative mapping of tissue or other material properties. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when RF energy is applied to a volume that has both bone and muscle tissue, then both the bone and muscle tissue will produce an NMR signal. However the "bone signal" represents a first resonant species and the "muscle signal" represents a second resonant species and the two will be different. These different signals from different species can be collected simultaneously over a period of time to collect an overall "signal evolution" for the volume.

The random or pseudorandom measurements obtained in MRF techniques are achieved by varying the acquisition parameters from one repetition time (TR) period to the next, which creates a time series of signals with varying contrast. Examples of acquisition parameters that can be varied include flip angle (FA), radio frequency (RF) pulse phase, TR, echo time (TE), and sampling patterns, such as by modifying one or more readout encoding gradients.

From these random or pseudorandom measurements, MRF processes can be designed to map any of a wide variety of parameters, such as longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The random or pseudorandom measurements obtained in MRF techniques are achieved by varying the acquisition parameters from one repetition time ("TR") period to the next, which creates a time series of images with varying contrast. Examples of acquisition parameters that can be varied include flip angle, radio frequency ("RF") pulse phase, TR, echo time ("TE"), and sampling patterns, such as by modifying one or more readout encoding gradients. Thus, the success of MRF is largely due to a specialized, incoherent acquisition scheme. More specifically, a sequence of randomized flip angles and repetition times (i.e., $\{(\alpha_m, TR_m)\}_{m=1}^{M}$) can be used to generate a sequence of images ($\{I_m(x)\}_{m=1}^{M}$) with randomly varied contrast weightings, yielding incoherence in the temporal domain. Moreover, a set of highly undersampled variable density spiral trajectories can be used to acquire k-space data, which yields the spatial incoherence.

As a result of the spatial and temporal incoherence imparted by the this acquisition scheme, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

With these incoherently-sampled data, the conventional MRF reconstruction employs a template-matching procedure. Given a range of parameters of interest, the procedure uses a "dictionary" that contains all possible signal (or magnetization) evolutions simulated from the Bloch equation. That is, MRF matches an acquired magnetization signal to a pre-computed dictionary of signal models, or templates, that have been generated for different acquisition parameters from magnetic resonance signal models, such as Bloch equation-based physics simulations.

Thus, quantitative parameter maps can be generated from these acquired signals based on a comparison of the signals to the predefined dictionary of predicted signal evolutions. Each of these dictionaries is associated with different combinations of material, environmental, and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best correspond to the observed signal evolution. The selected signal vector includes values for multiple different quantitative parameters, which can be extracted from the selected signal vector and used to generate the relevant quantitative parameter maps.

As described above, quantitative parameters can be estimated in MRF by matching acquired signals with pre-computed signals that are stored in a relatively large dictionary of tissue parameters. This matching can require significant processing time to match acquired signals to the large dictionary, and large storage space is needed to store the dictionaries. Additionally, the range of the tissue parameters needed in a dictionary can be imprecise based on different pathological conditions, and can also be subject dependent. As a consequence, a new dictionary often needs to be generated to cover those cases where the acquired signals correspond to tissue parameters outside of the range covered by the currently available dictionary. The systems and methods of the present disclosure overcome these drawbacks by using sparsely sampled dictionaries that are more computationally manageable, and that are specifically tailored to the acquired data.

Referring now to FIG. 1, a flowchart 100 is provided that sets forth the steps of an example method for estimating quantitative parameters using MRF techniques and a sparsely sampled dictionary used to train a neural network to reconstruct the acquired data. The method may begin (step 102) by generating (or otherwise obtaining) a dictionary, as indicated at step 104. Such a dictionary need not include all possible tissue parameter combinations, but instead may be sparsely sampled; that is, the dictionary may be generated to include a subset (fraction) of potential tissue parameter combinations. In one example, the sparsely sampled dictionary may be generated by first selecting a parameter range that represents a sparse sampling of the acquisition parameter space. This sparsely sampled dictionary may coarsely sample the acquisition parameters used when acquiring the provided data.

Figure 4A:
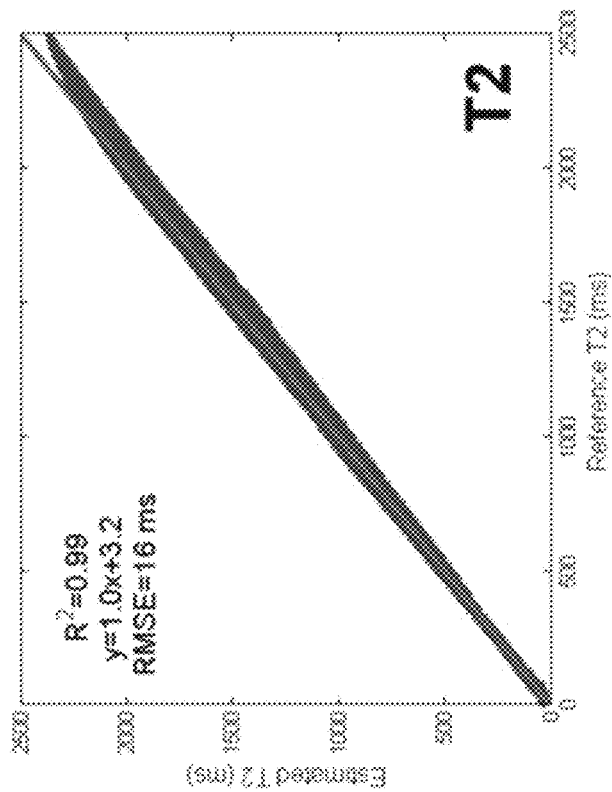
FIG. 4A is a graph showing true T1 and T1 reconstructed by a network trained on a distinct dictionary, where the inner line indicates the least-squares fit curve and overall illustrating excellent agreement (R2=0.99) with the true values with a negligible bias in T1 of 1.6 ms.
Figure 4B:
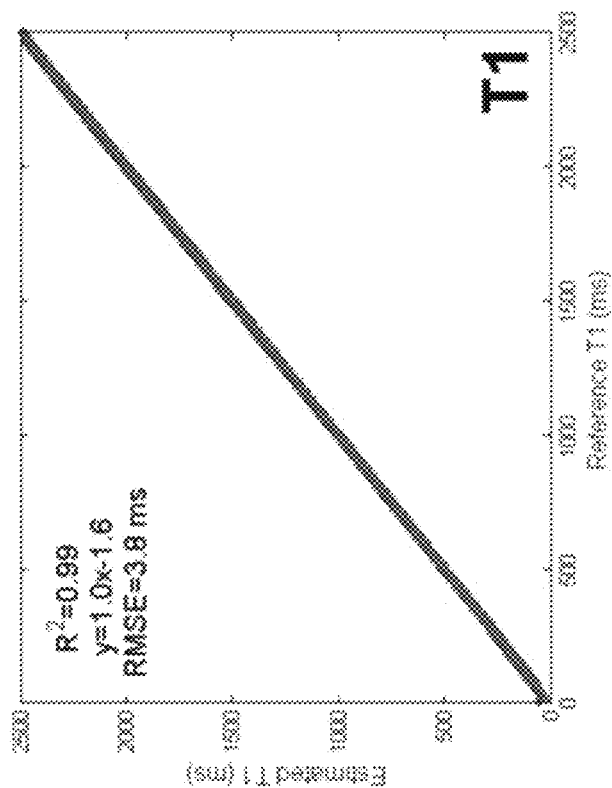
FIG. 4B is a graph showing true T2 and T2 reconstructed by a network trained on a distinct dictionary, where the inner line indicates the least-squares fit curve and overall illustrating excellent agreement (R2=0.99) with the true values with a negligible bias in T2 of 3.2 ms.

A neural network may then be trained using the dictionary, as indicated at step 106. The neural network is trained to reconstruct MRF data acquired using the sparsely sampled dictionary. As one non-limiting example, the feasibility of the neural network reconstruction was tested with a training dictionary of ~69000 entries consisting of $T_1$ and $T_2$ in the range 1-2500 ms in increments of 2 ms between 1-300 ms and increments of 10 ms between 300-2500 ms, excluding entries where $T_1 < T_2$. An additional set was also defined that included $T_1$ and $T_2$ values absent from the training dictionary to test the network's ability to reconstruct tissue parameters values outside its training set. The same range and increments of $T_1$ and $T_2$ values were used for the test set but with a different starting point to ensure that there was no overlap with the training dictionary. Reconstruction of the test set data was used to verify the efficacy of training by comparing the resultant values to the true values which showed excellent agreement to the true T1 and T2 values (FIGS. 4A and 4B).

Figure 5:
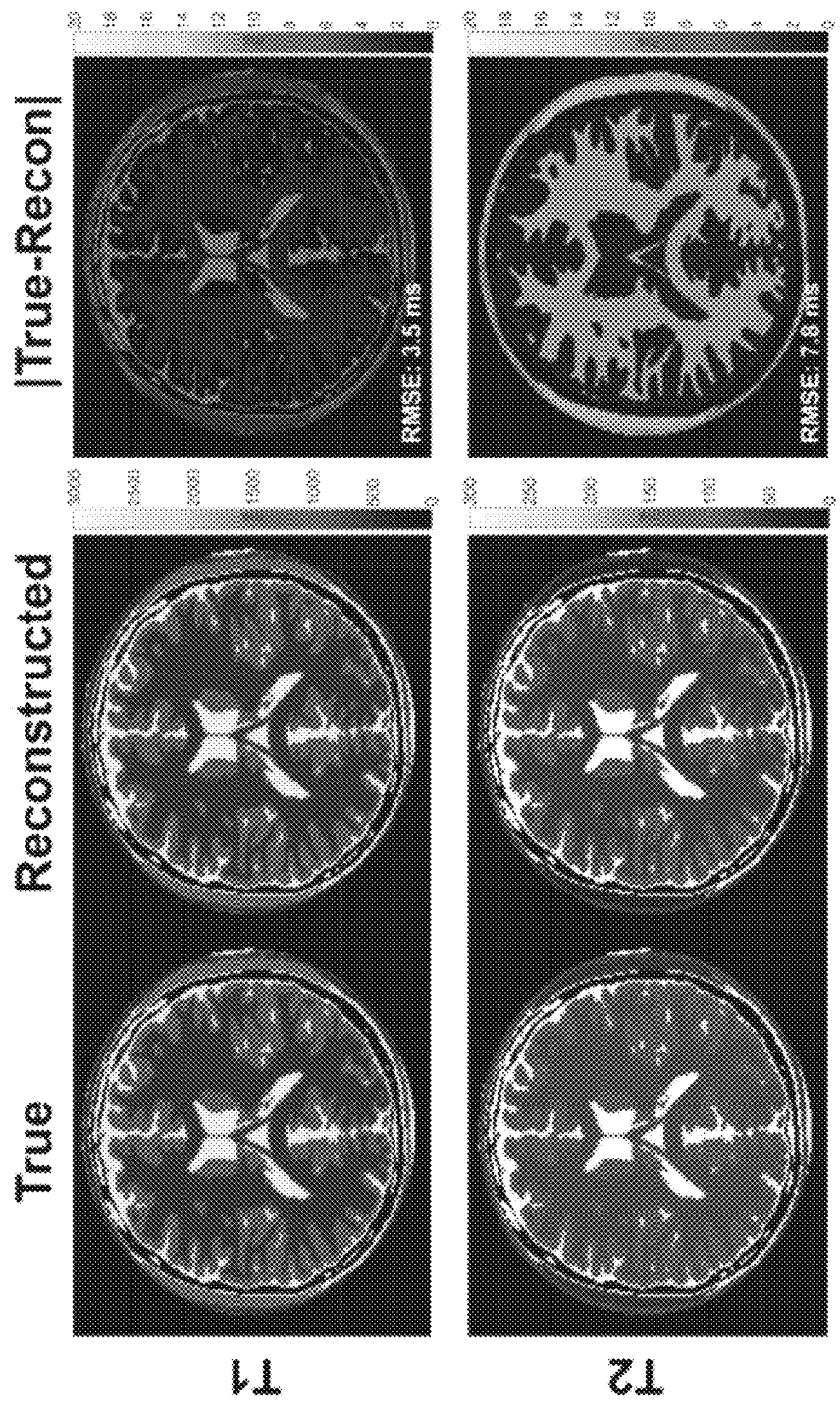
FIG. 5 is a set of images showing true and reconstructed T1/T2 images from the numerical brain phantom shown on a common ms scale and the associated error map.

As a second non-limiting example, the performance of the network in reconstruction of realistic brain $T_1$ and $T_2$ values was assessed in a digital brain phantom and the reconstructed tissue maps were used to calculate the root-mean-square error (RMSE) in the reconstructed $T_1$ and $T_2$ maps (FIG. 5).

Figure 6B:
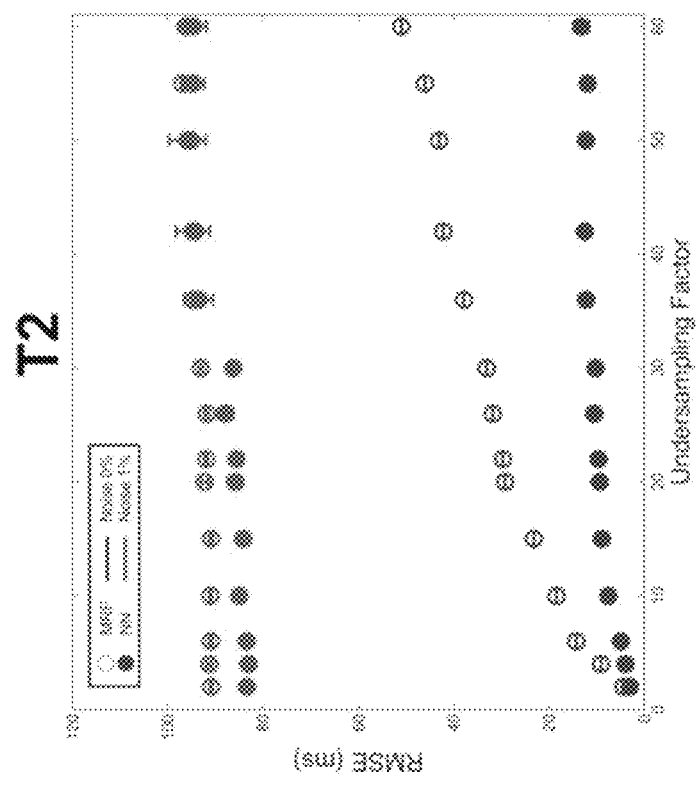
FIG. 6B is a graph showing RMSE of the MRF dictionary matching (open circles) and NN reconstruction (closed circles) for the different undersampling factors and noise levels tested, whereby, for the noiseless acquisition the error in the NN reconstruction was 4 fold smaller for T2 at the largest undersampling factor tested and, for the noisy acquisition only tissues with T2s>11 ms were included in the error calculation for the MRF dictionary matching whereas all tissues were included in the NN reconstruction error.
Figure 6A:
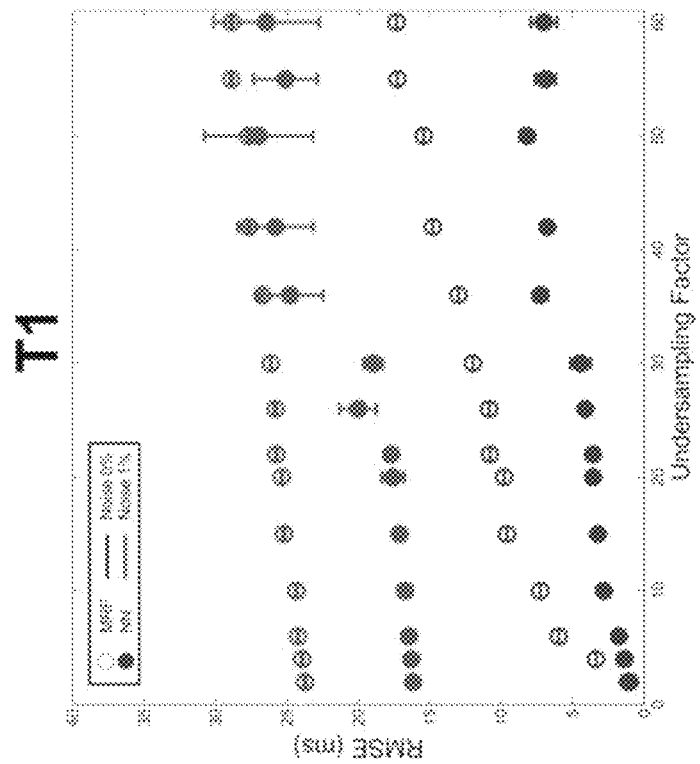
FIG. 6A is a graph showing RMSE of the MRF dictionary matching (open circles) and NN reconstruction (closed circles) for the different undersampling factors and noise levels tested, whereby, for the noiseless acquisition the error in the NN reconstruction was 2 fold smaller for T1 at the largest undersampling factor tested.
Figure 7A:
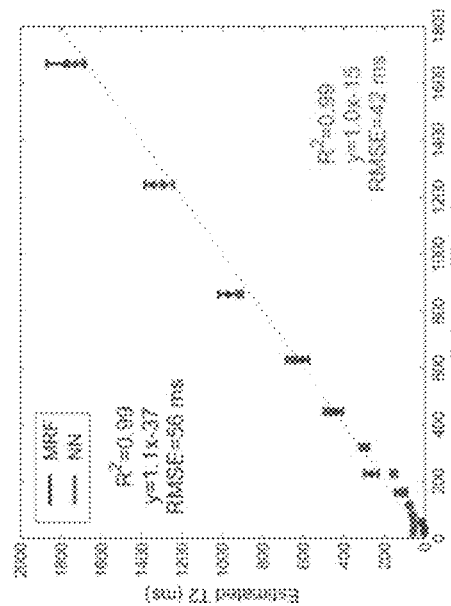
FIG. 7A is a graph showing NN and MRF dictionary matching reconstructions of the ISMRM/NIST phantom for the sequences tested for reference and measured compartment T1 values for data acquired with the optimized MRF EPI sequence at 1.5 T.
Figure 7B:
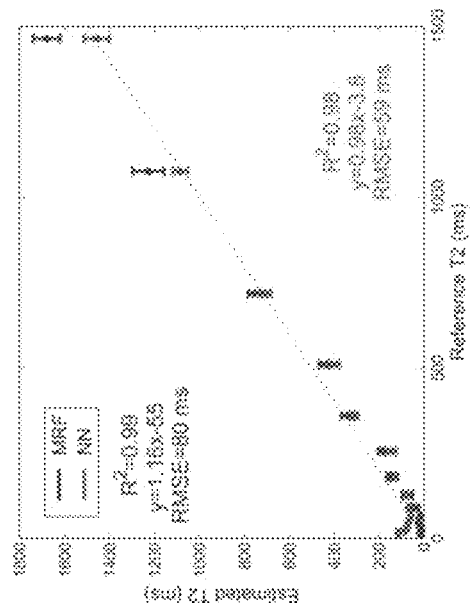
FIG. 7B is a graph showing NN and MRF dictionary matching reconstructions of the ISMRM/NIST phantom for the sequences tested for reference and measured compartment T2 values for data acquired with the optimized MRF EPI sequence at 1.5 T.
Figure 7C:
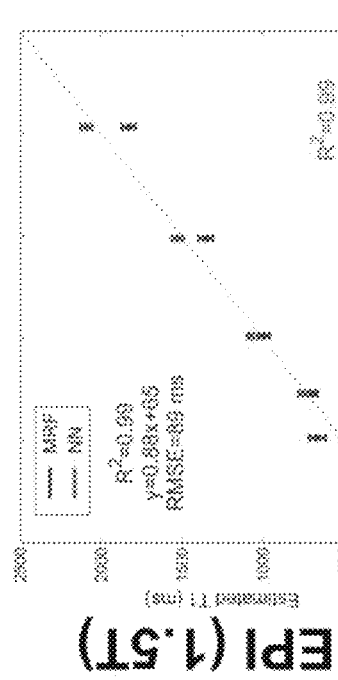
FIG. 7C is a graph showing NN and MRF dictionary matching reconstructions of the ISMRM/NIST phantom for the sequences tested for reference and measured compartment T1 values for data acquired with the spiral readout MRF FISP sequence at 3 T.
Figure 7D:
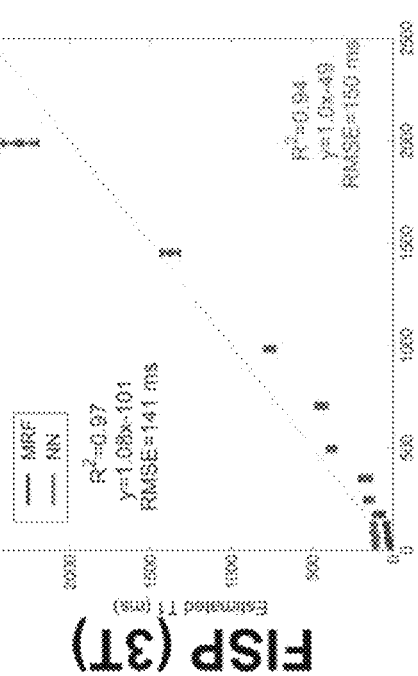
FIG. 7D is a graph showing NN and MRF dictionary matching reconstructions of the ISMRM/NIST phantom for the sequences tested for reference and measured compartment T2 values for data acquired with the spiral readout MRF FISP sequence at 3 T.

As a third non-limiting example, the effect of the training dictionary density on the resulting reconstruction error was measured by sub-sampling the initial dictionary variously from 2 to 60 fold. The network was then trained with each sub-sampled dictionary and used to reconstruct the initial, fully sampled dictionary whose entries were corrupted by zero mean Gaussian noise with standard deviation of either 0 (i.e. noiseless) or 1%. The neural network reconstruction was also compared to a conventional MRF dictionary matching reconstruction by matching the initial, fully sampled dictionary to each sub-sampled dictionary and calculating the resultant error. The neural network reconstruction was significantly more robust to noise and dictionary undersampling in comparison to dictionary matching (FIGS. 6A and 6B).

As a fourth non-limiting example, the accuracy and precision of the neural network reconstruction was assessed using the International Society for Magnetic Resonance in Medicine (ISMRM)/National Institute of Standards and Technology (NIST) multi-compartment phantom with calibrated $T_1$ and $T_2$ values similar to those of the human brain. The phantom was scanned at two magnetic field strengths, 1.5 T and 3 T with a 50 frame MRF EPI sequence as well as a 600 frame MRF FISP pulse sequence and the images reconstructed with the neural network as well as conventional dictionary matching. The resulting $T_1/T_2$ maps were compared to the true phantom values which were characterized by NIST for each magnetic field strength. The neural network reconstruction showed excellent agreement with the true phantom values (FIGS. 7A-7D) and required only 10 ms for reconstruction of the 50 frame data and 176 ms for the 600 frame data.

Figure 8:
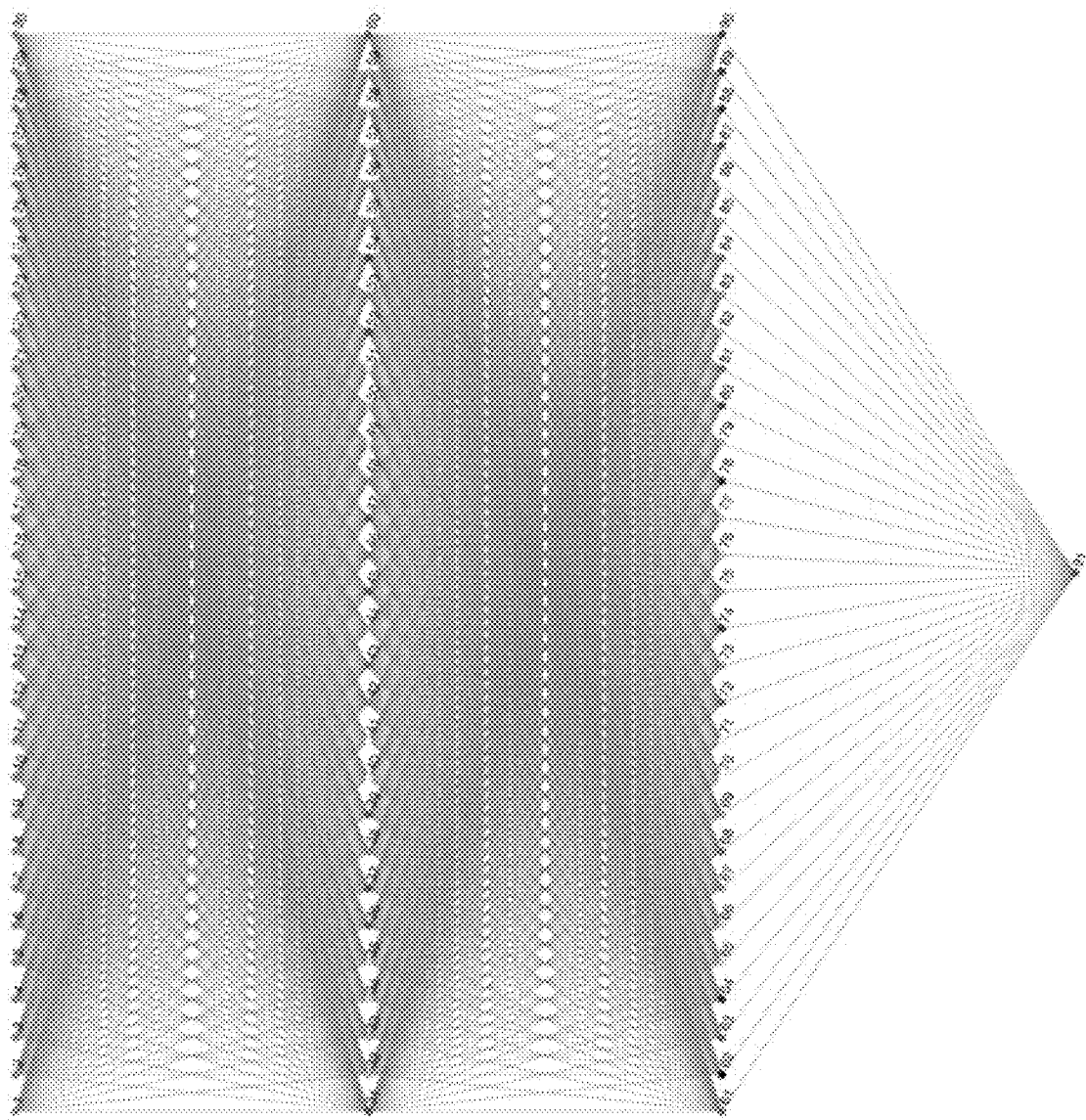
FIG. 8 is a representation of the architecture of a potential sparsely trained neural network requiring only 1800 coefficients as compared to about 238,800 floating-point coefficients in the corresponding training dictionary.
Figure 9A:
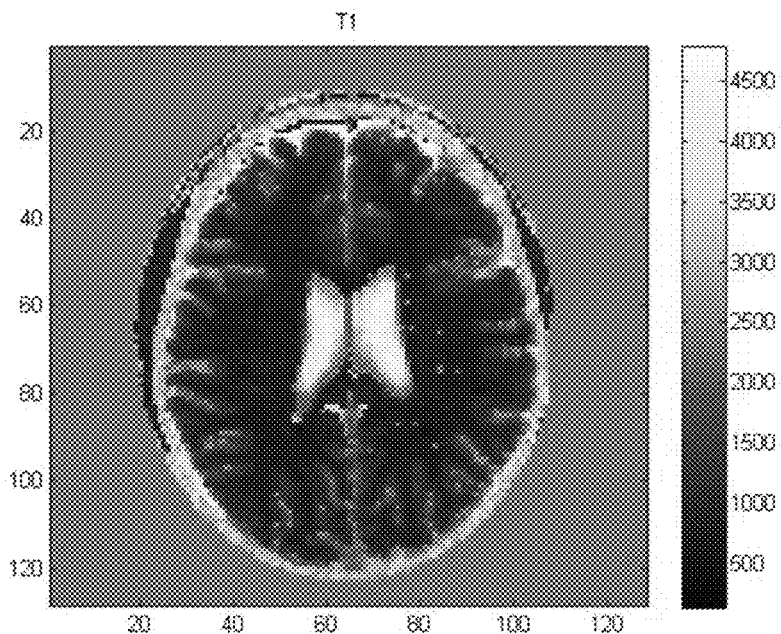
FIG. 9A provides a T1 map reconstructed using the sparsely trained neural network represented in FIG. 8.
Figure 9B:
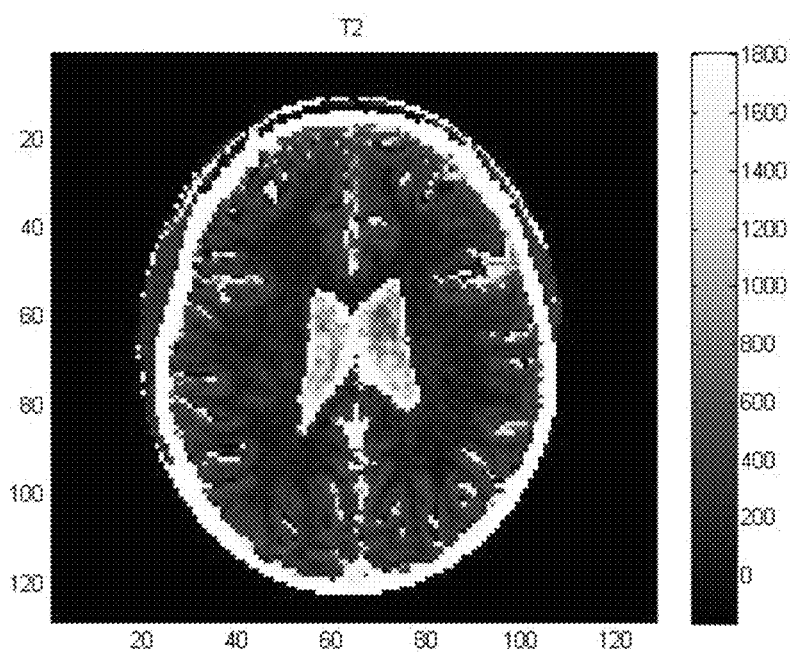
FIG. 9B provides a T2 map reconstructed using the sparsely trained neural network represented in FIG. 8.

As a fifth non-limiting example, a training dictionary with 7960 entries of length N=15 was used. The training dictionary required 7960×15=119400×2 (real and imaginary)= 238800 floating-point coefficients and allowed only a coarse reconstruction of the acquired data. In contrast the neural network required only 30×30×2=1800 coefficients (FIG. 8), representing a 130 fold reduction, and correctly reconstructed example $T_1$ and $T_2$ maps (FIGS. 9A and 9B). The compact representation of the network can therefore allow fast reconstruction despite the large number of tissue parameters studied.

The method may include acquiring or otherwise providing data, as indicated at step 108. For instance, MR data are acquired with an MR system performing a suitable MRF data acquisition. As another example, data can be provided, such as by retrieving previously acquired data from a suitable storage medium. After data are acquired or otherwise provided, the trained neural network may be used to reconstruct the acquired/retrieved MR data, as indicated at step 110.

Figure 10:
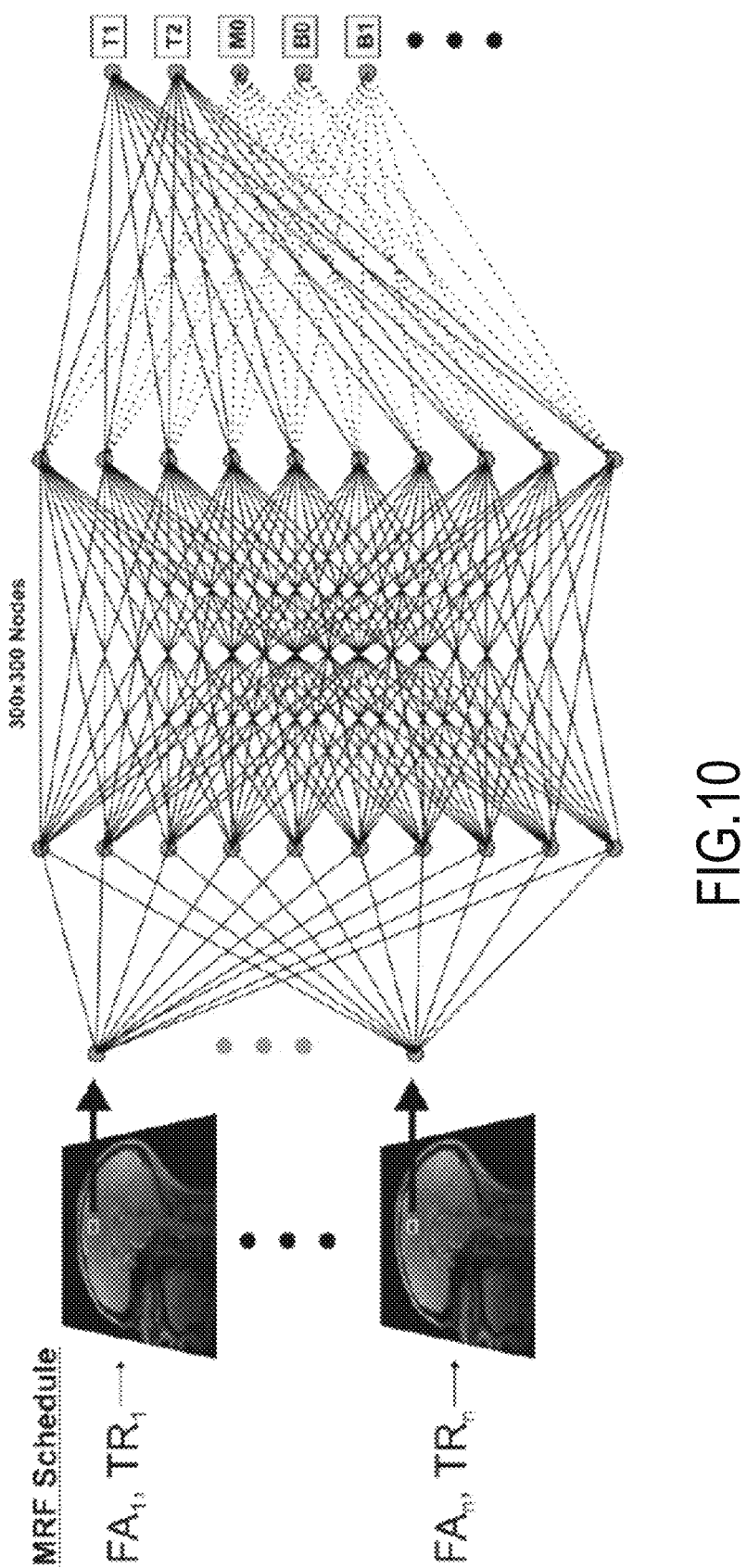

As one non-limiting example, a four layer fully-connected NN was created that was composed of input and output layers and two hidden layers is illustrated in FIG. 10. In the illustrated example, the input layer consisted of 25 or 50 nodes to correspond to the magnitude images acquired with our schedule optimized echo-planar imaging (EPI) MRF sequence or 571 nodes to correspond to images acquired with a conventional MRF sequence with sliding-window filtering. Complex-valued images can also be processed by this architecture by splitting the real and imaginary channels, or through the use of a complex-valued network. In this non-limiting example, only T1 and T2 were considered so the output layer included two nodes. Reconstruction of additional parameters simply requires a larger output layer. Each of the two hidden layers had 300 nodes. The network size was empirically selected to ensure accurate functional mapping while avoiding the risk of overfitting. The chosen size represented a good compromise between the required training time, storage space and accuracy of the resultant reconstructions. The network was trained by the ADAM stochastic gradient descent algorithm with the learning rate set to 0.001 and the loss function (cost) defined as the mean squared error:

$$LF = \frac{1}{n}\sum_{k=1}^{n}(P^k_{training} - P^k_{recon})^2;$$

where k ranges over the n training samples and P is the training or reconstructed tissue parameter of interest (T1 or T2 in this study). Two different activation functions were defined. A hyperbolic tangent (tanh) function was used for the hidden layers with a sigmoid function used for the output layer. In total, the NN required storage of 300×300=90,000 coefficients.

If additional MR data are to be processed, as indicated at step 112, the method may return to step 108 to acquire and retrieve MR data. If it is determined that the dictionary used to train the neural network has been updated or otherwise modified, as indicated at step 114, the method may return to step 106 to (re)train the neural network. If there is no MR data to acquire/reconstruct, or if the dictionary is not updated, the method may end, as indicated at step 116.

MRF enables quantitative tissue mapping in a short acquisition time at the cost of increased complexity in the reconstruction. While computational resources are typically cheaper and more accessible than scanner time, the large dictionaries required for MRF applications can overburden even the most advanced hardware. To avoid this problem multi-parametric MRF dictionaries can be undersampled in some dimensions entailing an a priori reduction in accuracy. Instead, as described above, a multi-layer NN capable of modeling the history-dependent Bloch equations used in MRF sequences can be used. Unlike conventional dictionary matching where the acquired signals can only be matched to the discrete entries computed in the dictionary, the systems and methods provided herein utilize the functional representation of the NN, which yields continuous-valued parameter outputs. This is a notable advantage of the NN reconstruction since the reconstruction accuracy is no longer strictly limited by the dictionary density. Moreover, the network training process results in a signal-to-parameter mapping that is more robust to noise than a conventional dictionary matching approach because the mapping is forced to be expressed in low-dimensional space and is thus insensitive to small corruptive input perturbations. This mapping need not result a loss of accuracy provided that the salient features of the signal are adequately preserved by the NN, in analogy with truncation of small singular values in the singular value decomposition.

Conventional dictionary matching does not learn a functional mapping, relying instead on the similarity between the normalized measured data and the corresponding normalized dictionary entry.

A successful application of deep learning networks utilizes large and high quality training data. In a clinical context, large, high quality datasets may be difficult to obtain and expensive to generate. Training the network on simulated dictionary data facilitates the generation of arbitrarily large training sets. The present disclosure demonstrates that networks trained on simulated data can accurately reconstruct measured data despite the presence of inevitable noise and other sources of errors in the measurements.

The compact size of the NN solves many of the problems inherent to conventional dictionary matching. Specifically, the NN required merely ~5% of the storage and memory needed for storing even the small training dictionary used—larger dictionaries would reduce this fraction further. Because of its feedforward structure, reconstruction with the network was 300-fold faster than conventional dot product dictionary matching of the optimized MRF EPI data and up to 5000-fold faster for the larger MRF FISP data. With a network topology that is fixed, additional training entries simply modify the weights/biases of the network, but do not increase the reconstruction time. Similarly, because the architecture of the network (e.g., 300×300 fully-connected hidden layers) theoretically allows up to 6002 degrees of freedom (one weight and one bias per node), the inclusion of additional parameters in the reconstruction only requires increasing the size of the training dictionary, which would not affect the post-training reconstruction time. A larger network can better represent complicated functional mappings, albeit at the cost of increased reconstruction time and increased risk of overfitting the data.

Thus, MRF reconstruction by a NN has been demonstrated. Although the training time for the network used in these non-limiting examples were relatively small (~10-74 minutes), alternative methods can be used to yield faster training. The size of the network and the small number of images used with the optimized MRF EPI schedule contributed to the short training time but conventional MRF sequences that require a greater number of acquisitions (10-100 fold higher) will require a longer training time as will simultaneous reconstruction of additional tissue parameters given the larger training dictionary needed.

The sigmoid and tan h activation functions used in these non-limiting examples are a common choice for NN training but skew the accuracy of the network towards the middle of the training dictionary range where the gradient is largest and the back-propagation algorithm is thus most effective. These challenges are well known in the machine-learning literature with a number of techniques available for addressing it. Alternative training strategies and activation functions such as Softmax and ReLu can be used.

The systems and methods of the present disclosure are thus capable of implementing smaller (e.g., sparsely sampled) dictionaries for use in MRF applications. Moreover, neural networks can compactly represent complex functions and therefore require minimal memory or storage.

Figure 2:
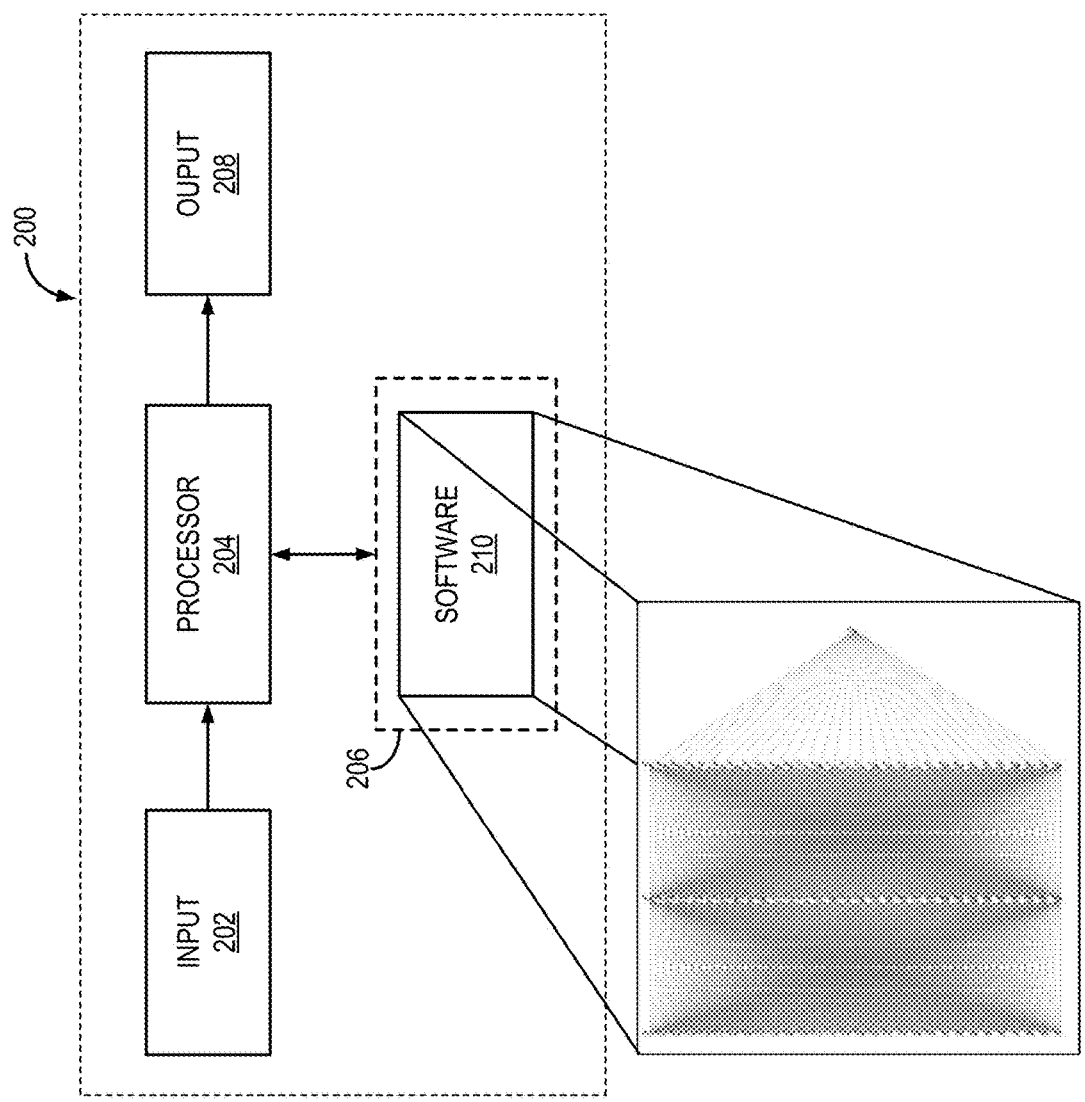
FIG. 2 is a block diagram of an example computer system that can implement some embodiments of the present disclosure.

Referring now to FIG. 2, a block diagram is illustrated of an example computer system 200 that can be used for producing an iteratively updated dictionary and for implementing an adaptive matching algorithm in accordance with some embodiments of the present disclosure. The system 200 generally may include an input 202, at least one processor 204, a memory 206, and an output 208. The system 200 may be, for example, a workstation, a notebook computer, a personal digital assistant ("PDA"), a multimedia device, a network server, a mainframe, or any other general-purpose or application-specific computing device. In some embodiments, the computer system 200 may form a part of a magnetic resonance imaging ("MRI") system, as will be described. The computer system 200 may operate autonomously or semi-autonomously, or may read executable software instructions from a computer-readable medium (such as a hard drive, a CD-ROM, flash memory, and the like), or may receive instructions from a user, or any another source logically connected to a computer or device, such as another networked computer or server, via the input 202.

The input 202 may take any shape or form, as desired, for operation of the computer system 200, including the ability for selecting, entering, or otherwise specifying parameters consistent with operating the computer system 200. In some instances, the input 202 may be designed to receive data acquired with an MRI system, which may be in the form of reconstructed images or raw k-space data.

Among the processing tasks for operating the computer system 200, the at least one processor 204 may be configured to perform the method described above with respect to FIG. 1.

The memory 206 may contain software 210, and may be configured for storage and retrieval of processed information and data to be processed by the processor 204. In some aspects, the software 210 may contain instructions directed to performing the method described above with respect to FIG. 1. In particular, the software may include, for example, instructions for acquiring or otherwise retrieving/receiving MR data. The software may also include instructions for implementing the neural network that is used to reconstruct the MR data that is provided. In certain configurations, the software may include instructions for training the neural network using a dictionary. In other configurations, the software may alternatively or additionally include instructions for generating the sparsely-sampled dictionary that is used to train the neural network. In yet other configurations, the software may include instructions for retraining the neural network if the dictionary is modified. The software may thus provide the code for the data acquisition, transfer, processing, and storage operations that can be used to implement exemplary processes like the one represented in FIG. 1.

Figure 3:
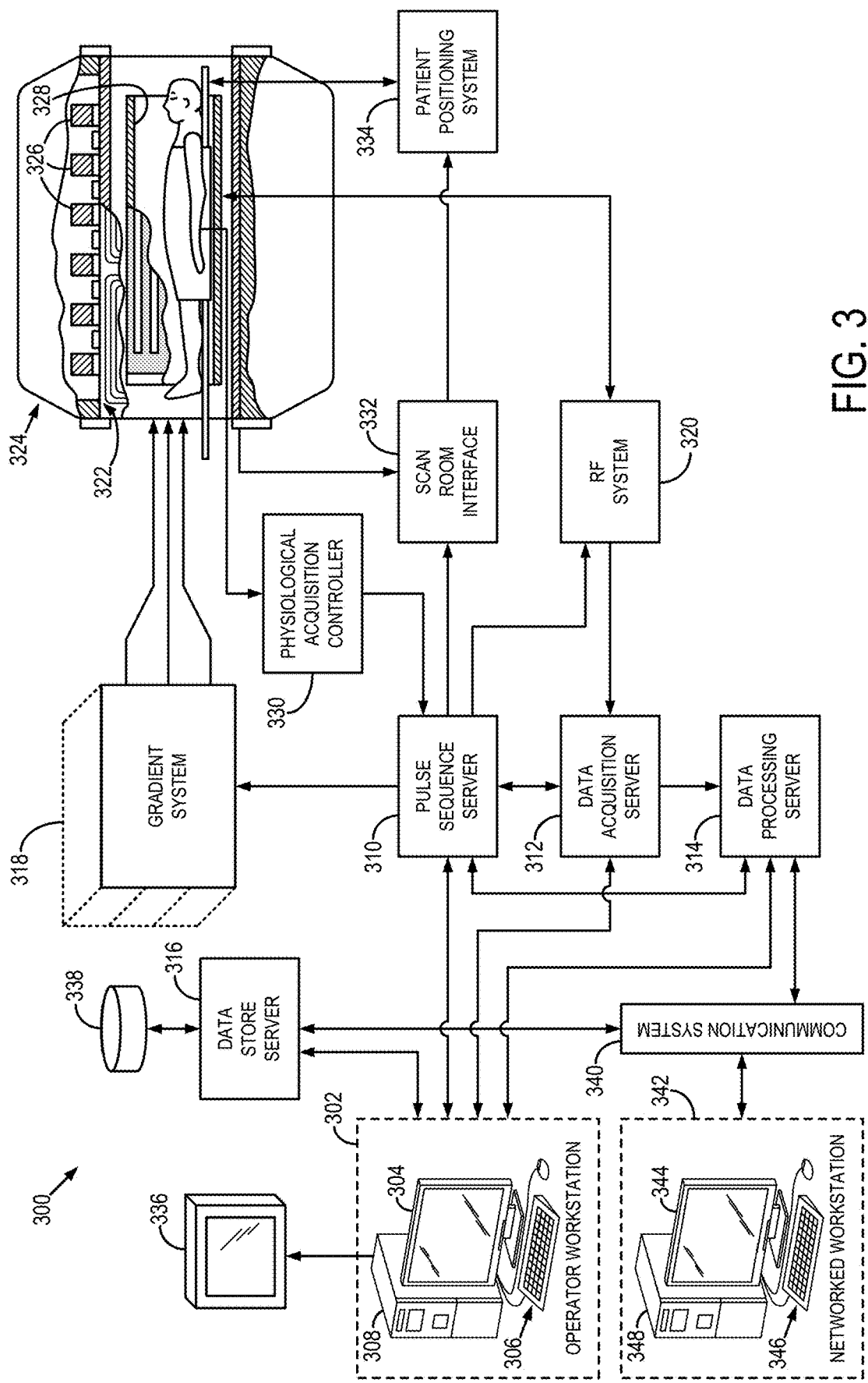
FIG. 3 is a block diagram of an example of a magnetic resonance imaging ("MRI") system.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (1);$$

and the phase of the received magnetic resonance signal may also be determined according to the following relationship:

$$\varphi = \tan^{-1}\left(\frac{Q}{I}\right). \qquad (2)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present disclosure has described one or more preferred embodiments, and it should be appreciated that many equivalents, alternatives, variations, and modifications, aside from those expressly stated, are possible and within the scope of the invention.

The invention claimed is:

1. A method for estimating quantitative parameters of a subject using a magnetic resonance fingerprinting (MRF), the method comprising:
   a. training a neural network using a dictionary comprising sample magnetic resonance (MR) signal evolutions;
   b. receiving MR data acquired with an MR system, the acquired MR data representing a plurality of different signal evolutions acquired using different acquisition parameters such that the different signal evolutions are incoherent in the temporal domain; and
   c. using the neural network to reconstruct the MR data into a report including information about the quantitative parameters.

2. The method of claim 1 wherein the dictionary is sparsely sampled to include a subset of possible tissue parameter combinations.

3. The method of claim 1 further including generating the dictionary.

4. The method of claim 3 wherein the dictionary is generated by selecting a parameter range representing a sparse sampling of an acquisition parameter space to coarsely sample the acquisition parameters used when acquiring the received MR data.

5. The method of claim 1 further including the step of retraining the neural network using a modified version of the dictionary.

6. The method of claim 1 wherein the neural network represents a 10-fold or greater reduction in coefficients used to reconstruct the MR data into an image.

7. The method of claim 1 wherein the neural network yields a 100-fold or greater reduction in coefficients used to reconstruct the MR data into an image.

8. A system for estimating quantitative parameters of a subject using a magnetic resonance (MR) system comprising:
   a memory with instructions stored therein;
   a processor configured to access the instructions stored in the memory and execute the instructions to cause the system to:
   a. train a neural network using a dictionary comprising sample magnetic resonance (MR) signal evolutions that are temporally incoherent;
   b. receive MR data acquired with an MR system, the acquired MR data representing a plurality of different signal evolutions acquired using different acquisition parameters such that the MR data is temporally incoherent; and
   c. use the neural network to reconstruct the received MR data.

9. The system of claim 8 wherein the dictionary is sparsely sampled to include a subset of possible tissue parameter combinations.

10. The system of claim 8 wherein the system is further configured to generate the dictionary.

11. The system of claim 10 wherein the dictionary generated by the system is sparsely sampled.

12. The system of claim 10 wherein system is configured to generate the dictionary by selecting a parameter range representing a sparse sampling of an acquisition parameter space to coarsely sample the acquisition parameters used when acquiring the received MR data.

13. The system of claim 8 wherein the system is further configured to retrain the neural network using a modified version of the dictionary.

14. The system of claim 8 wherein the neural network yields a 10-fold or greater reduction in coefficients used to reconstruct the MR data into an image.

15. The system of claim 8 wherein the neural network yields a 100-fold or greater reduction in coefficients used to reconstruct the MR data into an image.

16. A magnetic resonance imaging (MRI) system comprising:
 a magnet system configured to generate a polarizing magnetic field about at least a portion of a subject arranged in the MRI system;
 a magnetic gradient system including a plurality of magnetic gradient coils configured to apply at least one magnetic gradient field to the polarizing magnetic field;
 a radio frequency (RF) system configured to apply an RF field to the subject and to receive magnetic resonance signals from the subject using a coil array;
 a computer system programmed to:
  (a) control the magnetic gradient system and RF system to acquire MR data from the subject using random or pseudo-random acquisition parameters that are varied from one repetition time (TR) period to a next TR to elicit a plurality of different signal evolutions;
  (b) use a neural network to reconstruct the acquired MR data.

17. The system of claim 16 wherein neural network was trained using a dictionary.

18. The system of claim 17 wherein the dictionary used to train the neural network is sparsely sampled.

19. The system of claim 16 wherein the computer system is further programmed to train the neural network using a dictionary.

20. The system of claim 19 wherein the dictionary generated by the system is sparsely sampled.

21. A magnetic resonance imaging (MRI) system comprising:
 a magnet system configured to generate a polarizing magnetic field about at least a portion of a subject arranged in the MRI system;
 a magnetic gradient system including a plurality of magnetic gradient coils configured to apply at least one magnetic gradient field to the polarizing magnetic field;
 a radio frequency (RF) system configured to apply an RF field to the subject and to receive magnetic resonance signals from the subject using a coil array;
 a computer system programmed to:
  (a) control the magnetic gradient system and RF system to perform a plurality of sequence block each using different acquisition parameters designed to simultaneously produce a plurality of different signal evolutions in different resonant species and acquire MR data sampling the plurality of different signal evolutions from the subject;
  (b) generate a dictionary comprising a plurality of signal templates that coarsely sample acquisition parameters used when acquiring the MR data;
  (c) use the dictionary to train a neural network; and
  (d) reconstruct the acquired MR data using the neural network.

22. The system of claim 21 wherein the generated dictionary is sparsely sampled.

* * * * *

UNITED STATES PATENT AND TRADEMARK OFFICE
CERTIFICATE OF CORRECTION

PATENT NO. : 10,845,444 B2
APPLICATION NO. : 15/872449
DATED : November 24, 2020
INVENTOR(S) : Ouri Cohen et al.

Page 1 of 1

It is certified that error appears in the above-identified patent and that said Letters Patent is hereby corrected as shown below:

In the Specification

Column 3, Line 57, "tan h" should be --tanh--.

Column 8, Line 48, "tan h" should be --tanh--.

In the Claims

Column 12, Claim 6, Line 41, "represents" should be --yields--.

Signed and Sealed this
Second Day of February, 2021

Drew Hirshfeld
*Performing the Functions and Duties of the
Under Secretary of Commerce for Intellectual Property and
Director of the United States Patent and Trademark Office*